United States Patent [19]

Moynihan et al.

[11] Patent Number: 4,584,669
[45] Date of Patent: Apr. 22, 1986

[54] MEMORY CELL WITH LATENT IMAGE CAPABILITIES

[75] Inventors: Martin D. Moynihan, Annandale; Thomas A. Williams, Reston, both of Va.

[73] Assignee: International Business Machines Corporation, Armonk, N.Y.

[21] Appl. No.: 584,033

[22] Filed: Feb. 27, 1984

[51] Int. Cl.[4] .................... G11C 5/06; G11C 11/40
[52] U.S. Cl. .................................. 365/95; 365/154; 365/96
[58] Field of Search .............. 365/95, 96, 103, 104, 365/154, 189, 190, 203

[56] References Cited

U.S. PATENT DOCUMENTS

| | | | |
|---|---|---|---|
| 3,493,786 | 2/1970 | Ahrons et al. | 365/95 |
| 3,634,929 | 1/1972 | Yoshida et al. | 365/96 |
| 3,662,351 | 5/1972 | Ho et al. | 365/195 |
| 3,755,793 | 8/1973 | Ho et al. | 365/104 |
| 3,798,621 | 3/1974 | Baitinger et al. | 365/95 |
| 3,801,967 | 4/1974 | Berger et al. | 365/95 |
| 3,820,086 | 6/1974 | Ho et al. | 365/95 |
| 4,149,268 | 4/1979 | Waters | 365/95 |
| 4,175,290 | 11/1979 | Harari | 365/154 |
| 4,278,897 | 7/1981 | Ohno et al. | 307/455 |
| 4,418,401 | 11/1983 | Bansal | 365/95 |

OTHER PUBLICATIONS

Gonauser et al., "A Master Slice Design Concept Based on Master Cells in ESFI-SOS-CMOS Technology", Siemens Forsch.-u. Entwickl.-Ber. Bd. 5, #6, 1976, pp. 344-349.

Primary Examiner—James W. Moffitt
Assistant Examiner—Glenn A. Gossage
Attorney, Agent, or Firm—John E. Hoel; Horace St. Julian

[57] ABSTRACT

A CMOS circuit is disclosed which has a latent image feature for application in FET memory arrays for writable read only storage applications. A four device cross-coupled CMOS circuit is formed with minimum real estate area, so as to allow for wiring level programming into a preconditioned binary one or zero state. The preconditioned circuit will assume a preselected binary state when power is turned on. Thereafter, the circuit can be accessed for normal binary one and zero selective storage without a significant diminution in its operating characteristics, when compared with conventional CMOS cross-coupled storage circuits.

12 Claims, 9 Drawing Figures

CIRCUIT 10
A & A' CONNECTED
B & B' CUT
Q = HI: Q* = LO

CIRCUIT 20
A & A' CUT
B & B' CONNECTED
Q' = LO: Q'* = HI

TIMING FOR
CIRCUIT 10

TIMING FOR
CIRCUIT 20

SEC 8-8'
(OF FIG 5)

SEC 9-9'
(OF FIG 5)

MEMORY CELL WITH LATENT IMAGE CAPABILITIES

DESCRIPTION

1. Field of the Invention

The invention disclosed broadly relates to integrated circuits and more particularly relates to memory type integrated circuits.

2. Background of the Invention

Latent image memory circuits have been disclosed in the prior art, which are capable of assuming a predetermined binary state when power is turned on to the circuit. Prior art circuits employing bipolar transistor technology include U.S. Pat. Nos. 3,662,351; 3,801,967; and 3,820,086. Another approach to latent image memory circuits is described in U.S. Pat. No. 3,755,793 which discloses the use of both FET devices and charge-coupled devices to obtain the latent image memory operation. Still another approach to achieving latent image memory operation employing single conductivity type FET transistor technology is described in U.S. Pat. No. 3,798,621, wherein FET devices can be selectively added to a basic cross-coupled RAM storage cell, to achieve both read/write and read only memory operations. Still a further approach to achieving latent image memory operation is disclosed in U.S. Pat. No. 4,418,401 which describes an asymmetric RAM cell embodied in a complementary metal oxide semiconductor (CMOS) field effect transistor (FET) technology, wherein a single circuit topology is oriented either in a right-handed orientation or a left-handed orientation to permanently program in the initial storage state for each storage site.

What is required is a more simplified circuit topology suitable for implementation in a complementary MOSFET technology, which need not be programmed with the initial storage states at the early, device formation stages in the fabrication of the circuit, but can, instead, be programmed at the latest stages in its manufacture.

OBJECT OF THE INVENTION

It is therefore an object of the invention to provide an improved latent image CMOS memory cell which is more easily fabricated than has been available in the prior art.

It is another object of the invention to provide an improved latent image CMOS memory cell which can be programmed with the initial storage states at a relatively late stage of the manufacturing cycle.

It is still a further object of the invention to provide an improved latent image CMOS memory cell which is easier to program and operate, than has been available in the prior art.

SUMMARY OF THE INVENTION

These and other objects, features and advantages of the invention are accomplished by the preconditioned storage circuit disclosed herein. A CMOS circuit is disclosed which has a latent image feature for application in FET memory arrays. A four device cross-coupled CMOS circuit is formed in a minimum layout configuration, which allows for metal wiring level programming into a preconditioned binary one or a binary zero state. The preconditioned binary state will be assumed by the circuit when power is turned on. Thereafter, the circuit can be accessed for normal binary one and zero selected storage without a significant diminution in its operating characteristics, when compared with conventional CMOS cross-coupled storage circuits. The circuit includes two CMOS inverter circuits, each having a P channel FET and N channel FET connected in series between a positive voltage and ground potential. The output node of each respective CMOS inverter is connected to the gate of the N channel FET device in the other inverter circuit. Four selectively severable nodes are provided in the metallization interconnecting the four FET devices in the circuit so that the gate of the P channel FET device in the first one of the CMOS inverter circuits can be selectively connected to ground potential and the gate of the P channel FET device in the second one of the CMOS inverter circuits can be selectively connected to the output node of the first inverter circuit. In this configuration, the first P channel FET device will be more conductive than the second P channel FET device when power to the circuit is turned on, so that the output node of the first inverter circuit will become more positive than will the output node of the second inverter circuit, thereby manifesting the initial storage state of the circuit. This initial storage state is a permanently stored binary state which will always occur when the circuit is turned on. Alternately, the arrangement of the severable nodes in the interconnection metallurgy for the four FET devices can be selectively cut so that the output node of the second CMOS inverter circuit will be more positive when power is initially turned on to the circuit. Thus, all storage sites in the memory array can be constructed with the same configuration and the programming of the initial storage states for each respective storage site need not take place until after the interconnection metallization lines have been applied to the circuit. The resulting circuit is therefore more simple to fabricate, more simple to program, and more simple to operate than has been available in the prior art.

DESCRIPTION OF THE FIGURES

These and other objects, features and advantages of the invention will be more fully appreciated with reference to the accompanying figures.

DISCUSSION OF THE PREFERRED EMBODIMENT

Figure 1:
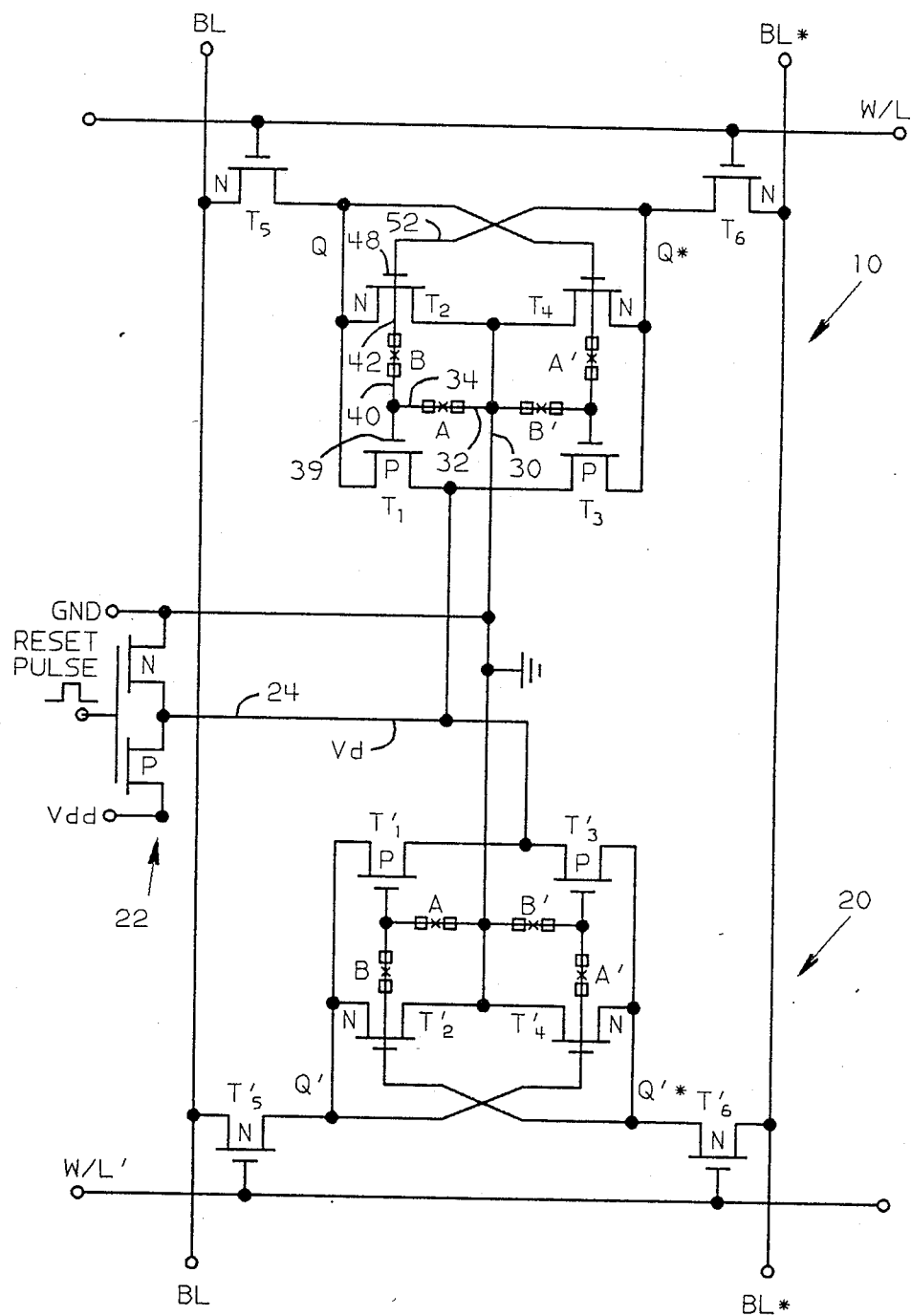
FIG. 1 is an overall circuit schematic diagram of two storage sites in a memory array, each storage site comprising the preconditioned storage circuit cell invention.

The memory array shown in FIG. 1 depicts two storage sites with a first preconditioned storage circuit cell 10 having a first initial storage state, and a second preconditioned storage circuit cell 20 having a second, opposite initial storage state. In the aggregate, the memory array is arranged with pairs of bit lines BL and BL* oriented in the vertical direction which are connected to bit line driver circuits which will write a first binary state by raising the voltage of the bit line BL and lowering the voltage of the bit line BL*, as is common in the prior art. The * symbol after a binary variable, such as BL*, symbolizes the complement of the variable BL. The bit lines BL and BL* are also connected to a sense amplifier so that during a read stage, a first binary state which has been stored at a storage site, will raise the potential of one of the bit lines BL and lower the potential of the other bit line BL*, as is common in the prior art. The memory array is organized into horizontal rows of the storage sites, with word lines WL which will selectively connect all of the storage cells along a particular row to the respective pairs of bit lines in each respective column occupied by the storage cells. An example of a similar orthogonal arrangement of bit lines and word lines in an FET memory array can be found in U.S. Pat. No. 3,798,621 to Baitinger, et al which is assigned to the instant assignee.

Figure 2:
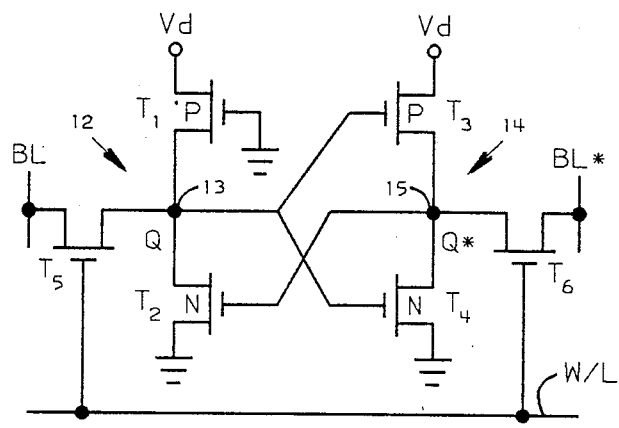
FIG. 2 is a circuit schematic diagram of the preconditioned storage circuit cell 10 of FIG. 1.
Figure 4:
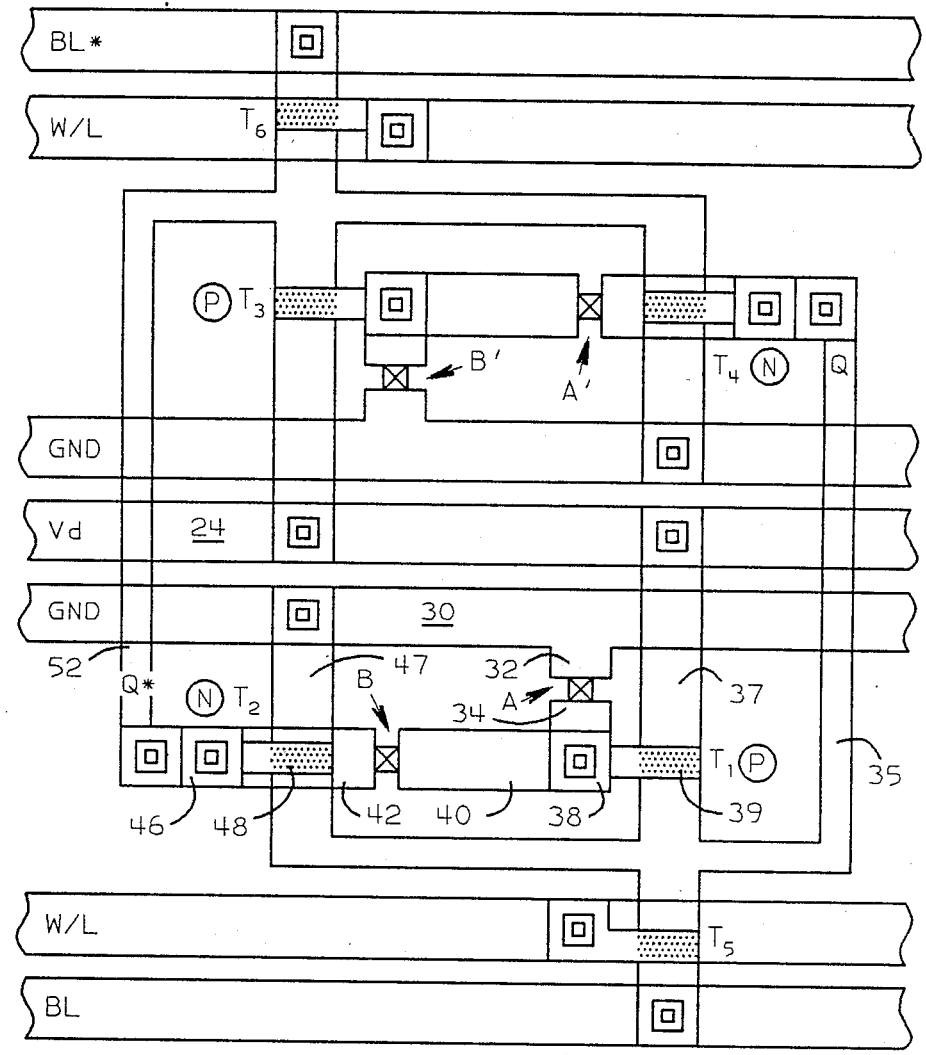
FIG. 4 is a layout diagram illustrating the arrangement of the diffusions and the polycrystalline silicon interconnection lines for the preconditioned storage circuit cell invention.
Figure 5:
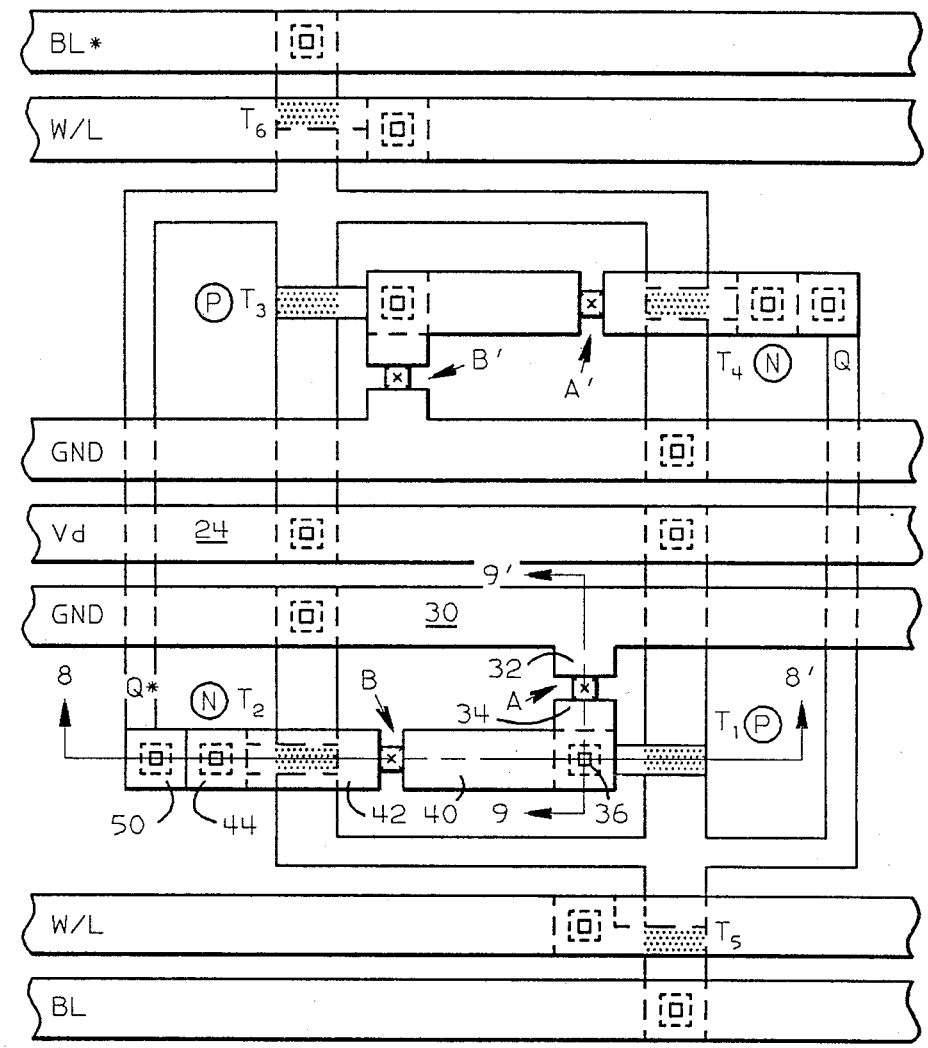
FIG. 5 is a layout diagram arranged in a similar manner to the diagram of FIG. 4, illustrating the arrangement of the metal interconnection lines which lie above the level of the diffusions and polycrystalline silicon gate interconnection lines of FIG. 4, in accordance with the preconditioned storage circuit cell invention.

The preconditioned storage circuit cell 10 in FIG. 1 is connected through the N channel isolation FET devices T5 and T6 to the respective bit lines BL and BL*, by means of applying a positive potential to the word line WL, which has the effect of connecting the node Q of the circuit 10 to the bit line BL and of connecting the node Q* of the circuit 10 to the bit line BL*. The preconditioned storage circuit cell 10 is shown in FIG. 1 as it is arranged in its physical layout which is depicted in FIGS. 4 and 5. The preconditioned storage circuit cell 10 of FIG. 1 is redrawn in FIG. 2 in a more conventional circuit schematic form, so as to facilitate the discussion of its topology and operation. The preconditioned storage circuit cell 10 shown in FIG. 2 is a four device cell consisting of a first complementary metal oxide semiconductor (CMOS) field effect transistor (FET) inverter circuit 12 made up of the P channel FET device T1 and the N channel FET device T2 which are series-connected between a positive potential VD and ground potential and which are joined at the output node 13. The second CMOS FET inverter circuit 14 of the preconditioned storage circuit cell 10, is made up of the P channel FET device T3 and the N channel FET device T4 which are series-connected between positive potential VD and ground potential and are joined at the output node 15. The output node 13 which is the Q node for the circuit, is connected to the gate of the N channel FET device T4 and the output node 15 which is the Q* node for the circuit, is connected to the gate of the N channel FET device T2.

In accordance with the invention, the circuit 10 in FIG. 2 is selectively programmed into a first initial storage state by selectively connecting the gate of the P channel FET device T1 to ground potential and also selectively connecting the gate of the P channel FET device T3 to the output node 13. This will cause the P channel FET device T1 to be more conductive than is the P channel FET device T3 when a positive potential VD is initially applied to the circuit. Since the P channel FET device is more conductive, the node 13 rises in potential faster than does the node 15 and thereby applies a positive potential to the gate of the N channel FET device T4 at a faster rate than would a positive potential be applied to the gate of the N channel FET device T2. Thus, the N channel device T4 turns on faster than the N channel FET device T2, thereby connecting the output node 15 to ground potential when the positive voltage VD is initially applied to the circuit 10. This will cause the N channel FET device T2 to remain in its off state, thereby reinforcing the positive potential state of node 13 for the circuit. Thus, when positive potential VD is initially applied to the circuit, the preconditioned storage circuit cell 10 of FIG. 2 will have a preprogrammed first initial storage state with the node 13 or the Q node having a higher potential than the potential of the node 15 or the Q* node of the circuit. Thus, when power is turned on to the circuit, either at the beginning of its operation, or after a power outage, an initial reading of the binary state of the circuit 10 by the bit lines BL and BL* through the isolation transistors T5 and T6, will reveal the state which was initially programmed into the circuit at the time of the programming of its metal interconnection layer as will be described hereinafter.

The preconditioned storage circuit cell 20 of FIG. 1 was physically identical to the cell 10 of FIG. 1 prior to the programming of its metallized interconnection layer to store its initial storage state. After the programming of its initial storage state, the preconditioned storage circuit cell 20 has the opposite binary state from that of the circuit 10 of FIG. 1. In order to distinguish the identity of the transistor devices in circuit 20 from those in circuit 10, corresponding FET devices in the circuit 20 will be designated with a prime such that the FET device T2 in circuit 10 will correspond to the FET device T2' in circuit 20. The diagram of circuit 20 in FIG. 1 reflects its physical layout as is shown in FIGS. 4 and 5 for circuit 10. However, to facilitate the discussion of the topology and operation of circuit 20, it has been redrawn in a more conventional circuit schematic diagram of FIG. 3.

Figure 3:
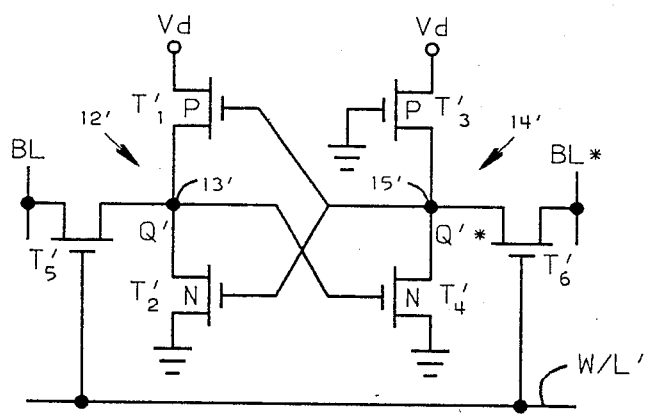
FIG. 3 is a circuit schematic diagram of the preconditioned storage circuit cell 20 of FIG. 1.

In FIG. 3, circuit 20 is composed of the first CMOS inverter 12' and a second CMOS inverter 14' which were originally fabricated in the identical manner to the fabrication of the first and second CMOS inverters 12 and 14 in the circuit 10, prior to the programming of the metallization layer for the two respective circuits. Circuit 20 in FIG. 3 has the P channel FET device T1', which corresponds to T1 in circuit 10, selectively programmed so that its gate is connected to the output node 15' or Q*' and correspondingly, the gate of the P channel FET device T3' is selectively connected to ground potential. In this configuration for circuit 20, when the positive potential VD is initially applied to the circuit, the P channel FET device T3' will be more conductive than is the P channel FET device T1'. Thus, the node 15' or the Q*' node will have a higher potential in the initial storage state than the potential of the node 13' or the Q' node. Thus, after the initial application of the positive potential VD on the circuit 20, when the word line WL' is made positive, the isolation transistors T5' and T6' will respectively connect the nodes Q' and Q*' to the bit lines BL and BL*, thereby outputting a more positive potential on the bit line BL* than the potential on the bit line BL. This is the opposite stored binary state to the stored binary state in circuit 10, for the initial storage states of the two circuits 10 and 20.

Figure 8:
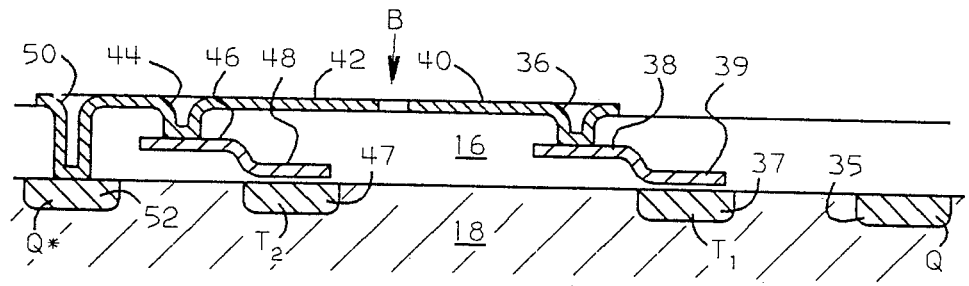
FIG. 8 is a cross-sectional view along the section line 8—8' of FIG. 5, showing a detailed illustration of the severable node B.
Figure 9:
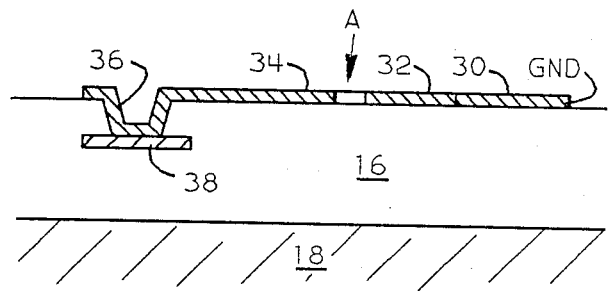
FIG. 9 is a cross-sectional view along the section line 9—9' of FIG. 5, showing a detailed view of the severable node A.

FIG. 4 shows the physical layout of the diffusions and polycrystalline silicon interconnection lines for the preconditioned storage circuit cell 10. If the reference numerals are primed in FIG. 4, the layout will also apply to the circuit 20 of FIG. 1 and FIG. 3. Overlying the diffusion and polycrystalline silicon interconnection line levels is the metallization level whose pattern is shown in FIG. 5. To more clearly illustrate the relative levels for the diffusions, polycrystalline silicon interconnection lines and metallization interconnection lines, cross-sectional views in FIGS. 8 and 9 are provided. The manner in which the initial storage state for the preconditioned storage circuit cell 10 can be selected is by selectively severing the B and the B' metallization nodes. The cross-sectional view 8—8' shown in FIG. 8 illustrates the structure of the metallization node B which is shown in its layout in FIG. 5 and which is shown in its circuit diagram context in FIG. 1. The metallized ground line 30 has a small spur 32 shown in FIG. 5 which connects to the necked-down portion A which is the A metallization node. The A metallization node is selectively severable by means of laser scribing, wet chemical or dry etching, or other semiconductor cutting techniques well-known to the prior art. In its uncut condition, the portion A is shown in FIG. 5 connected to the metallization 34 which connects to the contact portion 36 shown in cross-section in FIG. 8. The contact 36 connects the upper metallization level with the intermediate polycrystalline silicon interconnection level and specifically to the polycrystalline conductor 38. Polycrystalline silicon conductor 38 connects to the polycrystalline silicon gate 39 of the FET device T1. In the cross-sectional view of FIG. 8, the end of the diffusion 37 can be seen aligned with the gate 39 and the cross-section of diffusion 35 of the Q node can also be seen. The metal contact 36 continues as a metallization line 40 to the severable metallized node B. The metallized node B is the node which is selectively severed, along with the node B', in order to achieve the circuit 10 of FIG. 2 and FIG. 1. The metallized and selectively severable node B is a necked-down portion of the metallized lines 40 and 42. The metallized line 42 then continues onto the metal contact portion 44 which serves to contact the polycrystalline silicon interconnection line 46 on the intermediate level. The polycrystalline silicon line 46 connects to the gate 48 of the FET device T2. The end of the diffusion 47 is also seen in FIG. 8 aligned with the gate 48. The metal contact 44 then continues onto the metal contact 50 which reaches down through the insulator layer 16 to the diffusion 52 in the semiconductor substrate 18.

A technique for selectively severing the nodes B and B' or alternately the nodes A or A' in the metallization interconnection network shown in FIG. 5 can be found in U.S. Pat. No. 4,198,696 which is assigned to the instant assignee. The physical layout of FIGS. 4 and 5 can be selectively programmed either to permanently store a first initial storage state corresponding to circuit 10 or a second permanent initial storage state as is shown for circuit 20, by selectively severing the appropriate pair of metallization nodes B and B' or alternately A and A', respectively, by rendering incident a laser beam to melt and separate the respective severed portions of the metallized line adjacent to the severable portion of the line. The composition of the metallization layer is typically aluminum which can optionally be doped with small quantities of copper and/or silicon as is known to the prior art. Thus, in order to achieve the circuit 10 from the physical layout embodiment of FIGS. 4 and 5, nodes B and B' are selectively severed and nodes A and A' are left intact. Thus, the gate of the P channel FET device T1 will be connected to ground potential and the gate of the P channel FET device T3 will be connected to the node Q. Therefore, when the positive voltage VD is initially applied to the circuit, the node Q will have a high potential and the node Q* will have a low potential.

Alternately, the physical layout of FIG. 4 and FIG. 5 can be selectively programmed to achieve the circuit 20 of FIG. 3 by selectively severing the A and the A' metallized nodes and leaving the B and B' nodes intact. This will connect the gate of the P channel FET device T3' to ground potential and the gate of the P channel FET device T1' to the node Q*'. Then when the positive potential VD is initially applied to the circuit, the node Q' will have a relatively low potential and the node Q*' will have a relatively high potential.

Operation of the Invention

Figure 6:
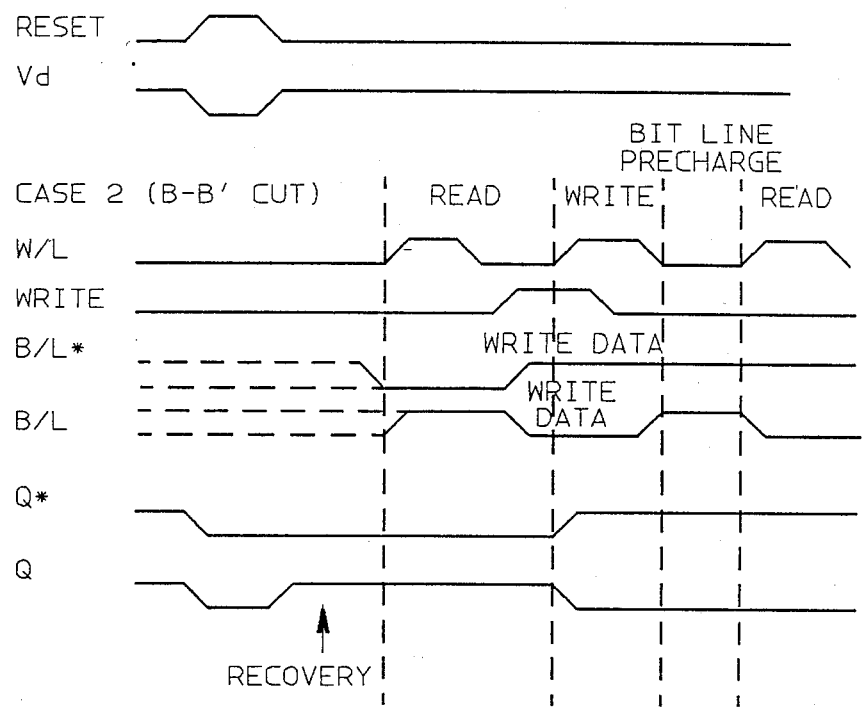
FIG. 6 is a timing diagram for the circuit 10.

The operation of the preconditioned storage circuit cell 10 is shown in conjunction with the timing diagram of FIG. 6. In order to illustrate a power outage condition, a reset circuit 22 of FIG. 1 is provided, which is a CMOS inverter with the gates of the P channel and N channel devices thereof connected to the reset signal and the output node thereof connected by line 24 as the VD positive potential to a circuit 10 and a circuit 20. Pulsing the reset waveform in FIG. 6 illustrates the sequence of events when the positive potential to the circuit 10 is interrupted. As can be seen in FIG. 6, the potential of both the Q node and the Q* node falls to ground potential when the positive potential VD is off. After the positive potential VD is reapplied to the circuit 10, the P channel FET device T1 is more conductive than the P channel FET device T3 and therefore the node Q is higher in potential than the node Q* and this is shown in the timing diagram of FIG. 6. If this had been a power failure, for example, a start-up procedure could be carried out wherein the information permanently stored in the initial storage states of the storage cells in the memory array would be read out in order to provide the initial program load conditions for turning on an associated data processor. This reading of the preconditioned state is shown in the timing diagram of FIG. 6 where the word line WL is turned on and the state of the bit line BL which is high and the bit line BL* which is low is read out and applied to a sense amplifier, thereby achieving the reading of the binary states of the read only memory portion of the circuit, that is the initial storage state of the circuit.

After the associated data processor has achieved its initial program load from reading the initial storage states of the cells in the memory array, the circuit 10 can be used as a conventional read/write random access memory storage site. This would begin with a write operation where the word line WL is positively pulsed and the respective states of the bit lines BL and BL* are then transferred through the isolation FET devices T5 and T6, respectively to the nodes Q and Q*, respectively. As is shown in FIG. 6, to change the state of the circuit 10, the state of the bit lines BL and BL* are transferred to the nodes Q and Q* of the circuit 10. Thereafter, if the current storage state of the circuit 10 is desired to be read out, the bit lines BL and BL* are both conditioned to be positive in the bit line precharge stage of FIG. 6, and then the word line WL is pulsed positive to render the devices T5 and T6 conductive. Then, the respective potentials at the nodes Q and Q* for the circuit 10 will be applied to the bit lines BL and BL*, respectively, and those two potentials can be sensed on the bit lines by a sense amplifier in the conventional manner.

Figure 7:
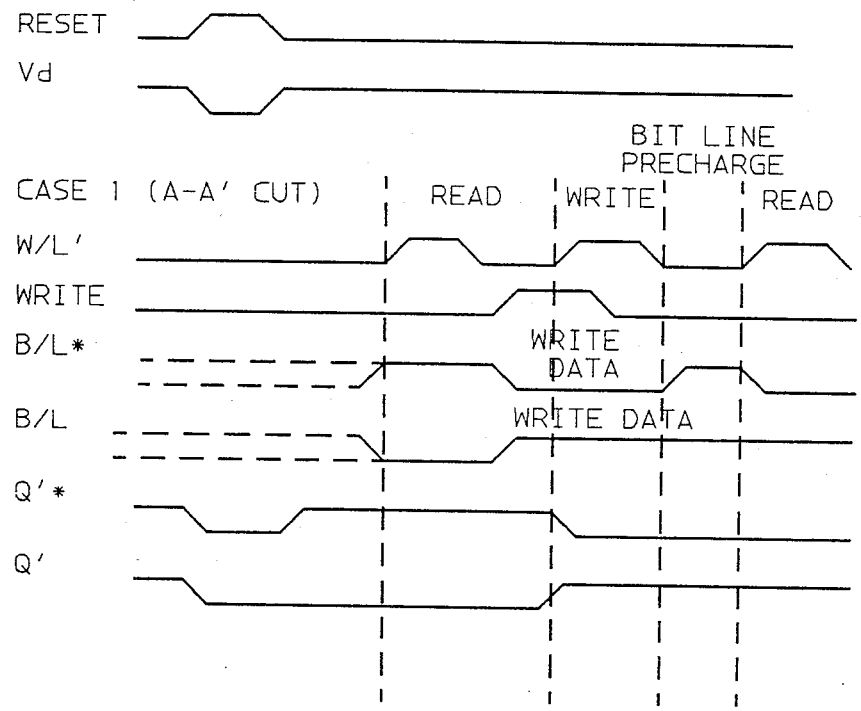
FIG. 7 is a timing diagram for the circuit 20.

The operation of the circuit 20 as shown in the timing diagram of FIG. 7 is similar to the operation of circuit 10 as shown in the timing diagram of FIG. 6.

Although the specific embodiment disclosed is applied in a memory array, the principle of the invention can also be applied to storage circuits not used in an array, such as flip-flop circuits and shift register latch circuits.

Although a specific embodiment of the invention has been disclosed it will be understood by those of skill in the art that the foregoing and other changes in form and details may be made therein without departing from the spirit and the scope of the invention.

We claim:

1. Personalizable preconditioned storage circuit formed on an integrated circuit chip, comprising:
   a first P channel FET device having its drain/source path connected between a drain voltage and a first node, and having its gate connected through a first severable connection to ground potential and further connected through a second severable connection line to a second node;
   a first N channel FET device having its drain/source path connected between said first node and ground potential, and its gate connected to said second node;
   a second P channel FET device having its drain/source path connected between said drain voltage and said second node, and having its gate connected through a third severable connection line to ground potential and further connected through a fourth severable connection line to said first node;
   a second N FET device having its drain/source path connected between said second node and said ground potential, and having its gate connected to said first node;
   said circuit having a first selectable latent image state wherein said first node charges up faster than said second node when said drain voltage turns on if said second and third severable connection lines have been selectively severed providing said first latent image operation for said circuit, said circuit thereafter operating as a read/write memory by selectively applying positive or ground potential to said first or said second node to dynamically store a selected binary state in said circuit; and
   said circuit having an alternate, second selectable latent image state wherein said second node charges up faster than said first node when said drain voltage turns on if said first and fourth severable connection lines have been selectively severed providing said second latent image operation for said circuit thereafter operating as said read/write memory be selectively applying positive or ground potential to said first or said second node to dynamically store a selected binary state in said circuit.

2. The circuit of claim 1, wherein said drain voltage turns on when electrical power is initially applied to the circuit.

3. The circuit of claim 1, wherein said drain voltage turns on after a power outage to the circuit.

4. A latent image read only memory and read/write memory circuit including first and second bit lines and a plurality of storage cells, each said storage cell being switchably connected to said first and second bit lines by a word line signal on a corresponding one of a plurality of word lines, the circuit comprising:
   a first latent image storage cell in said circuit, comprising:
   a first means for selectively programming the first latent image storage cell in one of a plurality of storage states;
   a first P channel FET device having its drain/source path connected between a drain voltage and a first node and its gate connected through the first programming means to ground potential and to a second node, said first node being switchably connected by means of a first word line signal to said first bit line;
   a first N channel FET device having its drain/source path connected between said first node and ground potential, and its gate connected to said second node, said second node being switchably connected by means of said first word line signal to said second bit line;
   a second P channel FET device having its drain/source path connected between said second node and said ground potential, and having its gate connected to said first node;
   a second N channel FET device having its drain/source path connected between said second node and said ground potential, and having its gate connected to said first node;
   said first node charging faster than said second node when said first cell is programmed in a selected one of said plurality of storage states providing a binary state latent image operation for said first cell, said first cell applying positive or ground potential to said first or said second node to dynamically store a selected binary state in said first cell;
   a second latent image storage cell in said circuit, comprising:
   a second means for selectively programming the second latent image storage cell in one of said plurality of storage states;
   a third channel FET device having its drain/source path connected between a drain voltage and a third node and its gate connected through the second programming means to ground potential and a fourth node, said third node being switchably connected by means of a second word line signal to said second bit line;
   a third N channel FET device having its drain/source path connected between said third node and ground potential, and its gate connected to said fourth node, said fourth node being switchably connected by means of said second word line signal to said first bit line;
   a fourth P channel FET device having its drain/source path connected between said drain voltage and said second node, and its gate connected to said third node;
   a fourth N channel FET device having its drain/source path connected between said fourth node and said ground potential, and having its gate connected to said third node;

said third node charging faster than said fourth node when said second cell is programmed in another one of said plurality of storage states providing a binary state latent image operation for said second cell, said second cell thereafter operating as a read/write memory by selectively applying positive or ground potential to said third or said fourth node to dynamically storage a selected binary state in said second cell.

5. The circuit of claim 4, wherein said drain voltage turns on when electrical power is initially applied to the circuit.

6. The circuit of claim 4, wherein said drain voltage turns on after a power outage to the circuit.

7. The circuit as recited in claim 4 wherein the first programming means includes first, second, third and fourth severable connection lines.

8. The circuit as recited in claim 7 wherein said selected one of said plurality of storage states is stored in said first cell when said first and said second severable connection lines are severed.

9. The circuit as recited in claim 8 where a second binary state latent image operation for said first cell is provided when said third and said fourth severable connection lines are severed.

10. The circuit as recited in claim 4 wherein the second programming means includes first, second, third and fourth severable connection lines.

11. The circuit as recited in claim 10 wherein said another one of said plurality of storage states is stored in said second cell when said first and said second severable connection lines are severed to provide a first binary state latent image operation for said second cell.

12. The circuit as recited in claim 11 where a second binary state latent image operation for said second cell is provided when said third and said fourth severable connection lines are severed.

* * * * *